United States Patent
Chang et al.

(10) Patent No.: US 7,829,448 B1
(45) Date of Patent: Nov. 9, 2010

(54) STRUCTURE OF HIGH ELECTRON MOBILITY TRANSISTOR, A DEVICE COMPRISING THE STRUCTURE AND A METHOD OF PRODUCING THE SAME

(75) Inventors: Edward Yi. Chang, Hsinchu County (TW); Yun-Chi Wu, Chiayi (TW); Yueh-Chin Lin, Taipei County (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 12/574,702

(22) Filed: Oct. 7, 2009

(51) Int. Cl.
*H01L 21/28* (2006.01)

(52) U.S. Cl. .............. 438/576; 438/167; 438/571; 438/572; 257/E21.046; 257/E21.047; 257/E21.374

(58) Field of Classification Search .............. 438/169, 438/574, 602, 606, 272, 572, 576, 578, 579; 257/E21.046, E21.047, E21.062, E21.064, 257/E21.116, E21.138, E21.326, E21.365, 257/E21.374, E21.405
See application file for complete search history.

(56) References Cited

U.S. PATENT DOCUMENTS

| | | | |
|---|---|---|---|
| 2003/0122152 A1* | 7/2003 | Kim et al. | 257/194 |
| 2004/0241947 A1* | 12/2004 | Wilk et al. | 438/285 |
| 2005/0148194 A1* | 7/2005 | Lan et al. | 438/706 |
| 2006/0145190 A1* | 7/2006 | Salzman et al. | 257/192 |
| 2008/0017844 A1* | 1/2008 | Nichols et al. | 257/20 |
| 2008/0108188 A1* | 5/2008 | Jeong et al. | 438/172 |

* cited by examiner

*Primary Examiner*—Walter L Lindsay, Jr.
*Assistant Examiner*—Cheung Lee
(74) *Attorney, Agent, or Firm*—CKC & Partners Co., Ltd.

(57) ABSTRACT

Disclosed herein are a structure of a metal oxide semiconductor pseudomorphic high electron mobility transistor (MOS-PHEMT) suitable for use in a semiconductor device, such as a single-pole-double-throw (SPDT) switch of a monolithic microwave integrated circuit (MMIC); and a method of producing the same. The MOS-PHEMT structure is characterized in having a gate dielectric layer formed by atomic deposition from a gate dielectric selected from the group consisting of $Al_2O_3$, $HfO_2$, $La_2O_3$, and $ZrO_2$, and thereby rendering the semiconductor structure comprising the same, such as a high frequency switch device, to have less DC power loss, less insertion loss and better isolation.

18 Claims, 8 Drawing Sheets

STRUCTURE OF HIGH ELECTRON MOBILITY TRANSISTOR, A DEVICE COMPRISING THE STRUCTURE AND A METHOD OF PRODUCING THE SAME

BACKGROUND

1. Field of Invention

The present disclosure in general relates to a structure fabricated on a III-V compound semiconductor wafer suitable for use as a semiconductor device such as switches and amplifiers of a monolithic microwave integrated circuit (MMIC); and a method of producing the same.

2. Description of Related Art

Conventional compound semiconductor devices such as high electron mobility transistor (HEMT) usually adopts Schottky gate for current modulation, however, such device is infamous for having a higher gate leakage current. Accordingly, there remains a need of an improved HEMT structure and a method of producing the same to overcome the problem in this art.

SUMMARY

In view of the above, one objective of this disclosure aims to provide an improved structure for fabricating semiconductor devices useful for microwave and radar applications, such devices would exhibit lower leakage gate current, less DC power loss, less insertion loss and better isolation.

The present disclosure is therefore directed to a structure fabricated on a III-V compound semiconductor wafer suitable for use in a semiconductor device; a semiconductor device comprising the structure; and a method of producing the same.

In one aspect of the present disclosure, a GaAs metal oxide semiconductor pseudomorphic high electron mobility transistor (MOS-PHEMT) structure is provided. The structure includes a substrate; a III-V compound semiconductor; a gate dielectric overlying the III-V compound semiconductor through atomic layer deposition; ohmic contacts coupled to the III-V compound semiconductor; and a gate electrode disposed on the gate dielectric. In one example, the gate dielectric is a thin film of $Al_2O_3$ with a thickness of about 8 to 20 nm.

In a second aspect of this disclosure, a method of fabricating the forgoing structure is provided. The method includes steps of: forming a III-V compound semiconductor on a substrate; forming a gate dielectric on the III-V compound semiconductor through atomic layer deposition; forming ohmic contacts through electron gun deposition (E-gun), in which the ohmic contacts are coupled to the III-V compound semiconductor; and applying a layer of metal on the gate dielectric to form a gate electrode.

In a third aspect, a GaAs MOS-PHEMT single-pole-double throw (SPDT) switch comprising the GaAs MOS-PHEMT structure fabricated by the method described above is provided. The MOS-PHEMT SPDT switch is characterized in having lower leakage gate current, less DC power loss, less insertion loss and better isolation when compared to a conventional PHEMT switch.

These and other features, aspects, and advantages of the present disclosure will become better understood with reference to the following description and appended claims.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DETAIL DESCRIPTION OF ILLUSTRATED EMBODIMENTS

Figure 1A:
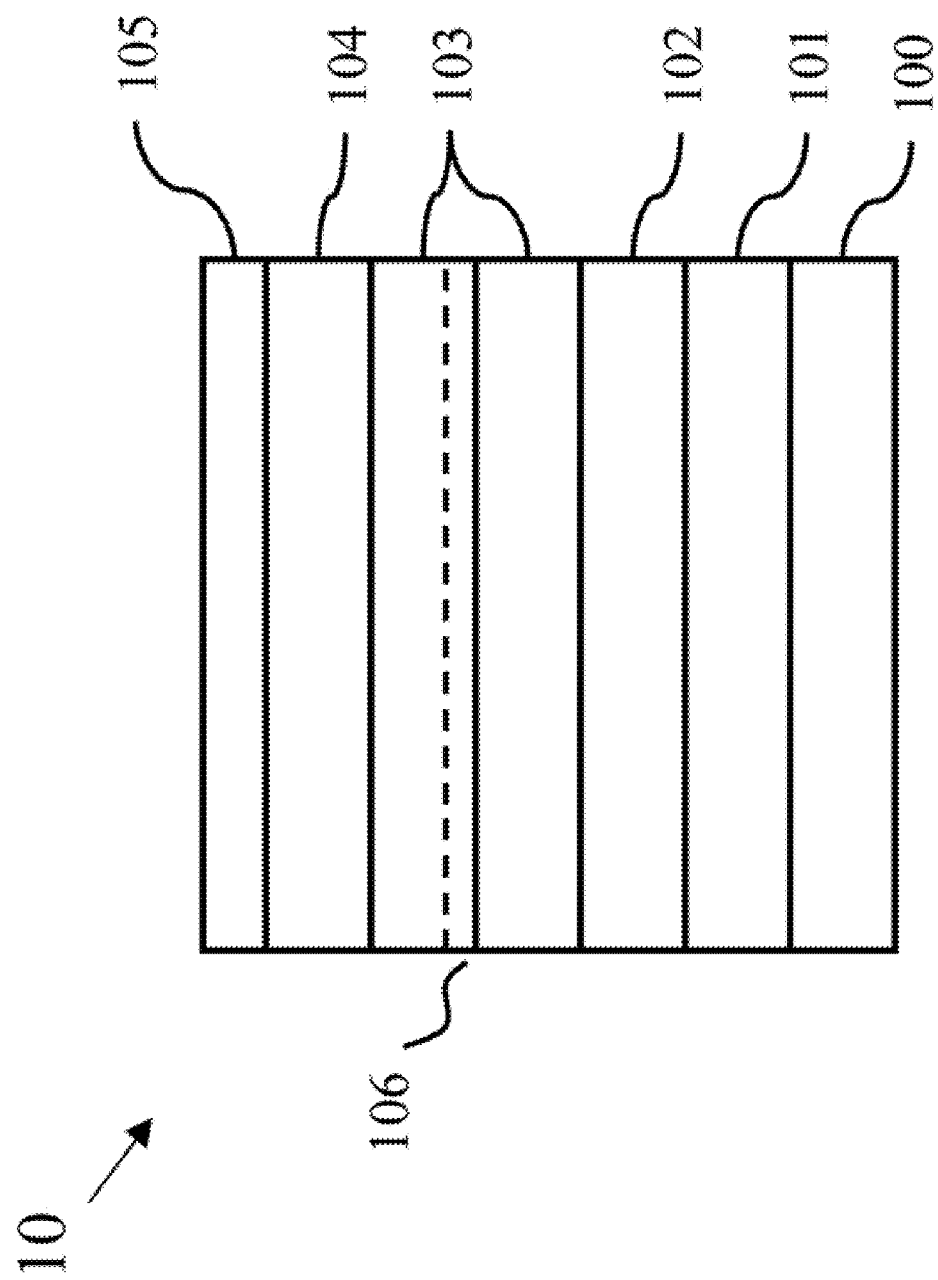
FIGS. 1A to 1E are schematic cross-sectional view of a GaAs MOS-PHEMT structure during fabrication in accordance with the method of this disclosure.

Reference will now be made in detail to the preferred embodiments of the disclosure, examples of which are illustrated in the accompanying drawings. Wherever possible, the same reference numbers are used in the drawings and the description to refer to the same or like parts.

The present disclosure is directed to a MOS-PHEMT structure fabricated on a III-V compound semiconductor wafer suitable for use in a semiconductor device such as a MOS-PHEMT SPDT switch; and a method for producing the same.

In one preferred embodiment of this disclosure, a GaAs metal oxide semiconductor pseudomorphic high electron mobility transistor (MOS-PHEMT) structure is fabricated on a III-V compound semiconductor wafer characterized in having a gate dielectric $Al_2O_3$ layer deposited through atomic layer deposition (ALD). The high-k dielectric $Al_2O_3$ can provide low gate leakage and thermal stability, and thereby allowing the fabricated semiconductor device such as a MOS-PHEMT SPDT switch to have less DC power loss, less insertion loss and better isolation for high frequency switch device.

In one embodiment, a MOS-PHEMT device 10 is fabricated on a III-V compound semiconductor wafer. The device is fabricated by the use of traditional lithography and lift-off techniques including mesa etch, recess etch, dielectric deposition, ohmic formation and gate formation. Details of a particular example for a GaAs MOS-PHEMT structure on a III-V compound semiconductor wafer are provided in table 1. The columns in Table 1 indicate, respectively, the function, nominal thickness in angstroms (Å) and mole fraction for each layer in the particular implementation.

A schematic cross-sectional view of a partially completed GaAs MOS-PHEMT structure is illustrated in FIG. 1A. According to the example, various epitaxial layers are grown sequentially on a substrate 100. The substrate 100 may be based on any Group III-V material, such as GaAs, InP or the like, and preferably GaAs or a GaAs-based material. Epitaxial layers may be grown on the substrate 100 using any known technique such as metal-organic chemical vapor deposition (MOCVD), or molecule beam epitaxy (MBE). In one aspect of this disclosure, a buffer layer 101 is first created on the substrate 100. The particular buffer layer 101 in the example of FIG. 1A is an undoped GaAs layer. Next, epitaxial layers are sequentially grown on the buffer layer 101, including, a 13 nm thick undoped InGaAs layer 102, and a 40 nm thick undoped AlGaAs layer 103 comprising a δ-dope therein. The δ-dope 106 is indicated by the dash-line. In the particular example of FIG. 1A, the undoped InGaAs layer 102 is an undoped $In_{0.2}Ga_{0.8}As$ layer, and the undoped AlGaAs layer 103 is an undoped $Al_{0.25}Ga_{0.75}As$ layer comprising a δ-dope therein. Next, in the particular example of FIG. 1A, other layers can be grown, including an AlAs layer 104 of about 1.5 nm, followed by a n-type GaAs layer 105 of about 60 nm.

Figure 1B:
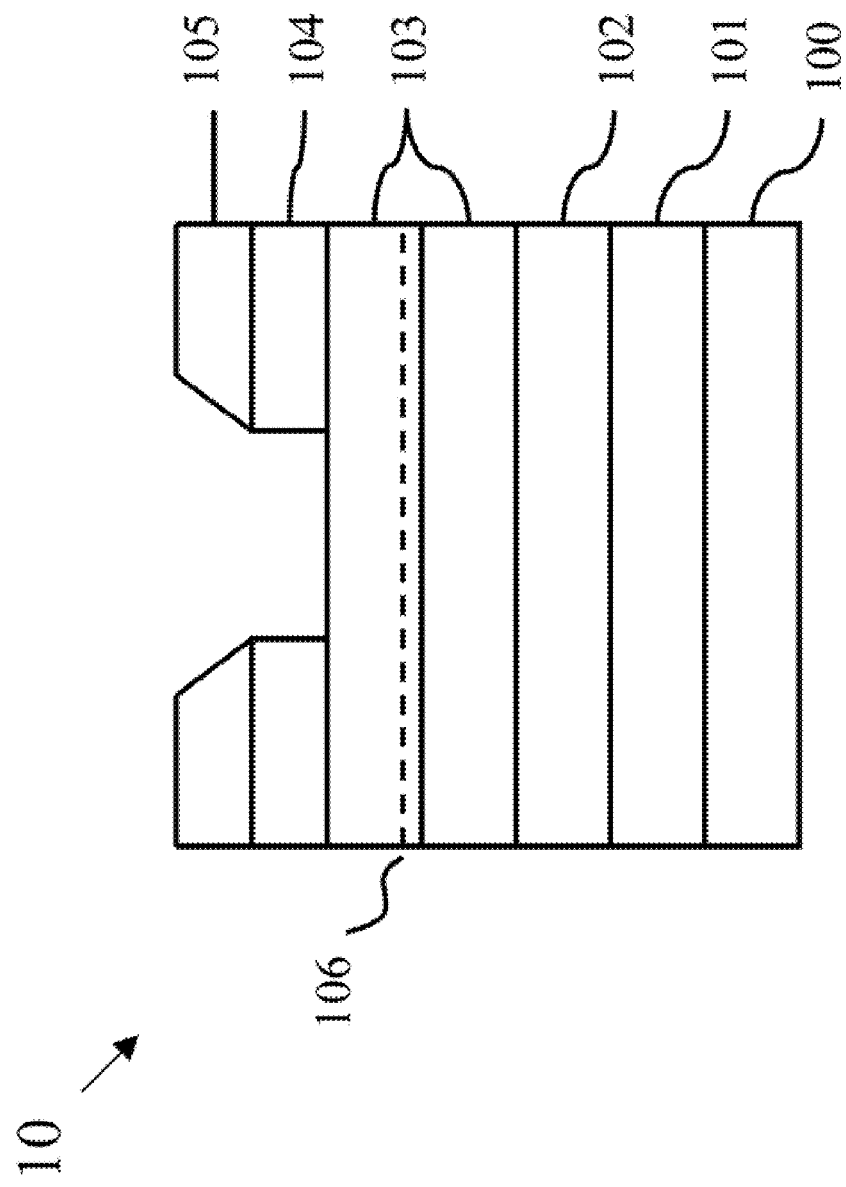
Figure 1C:
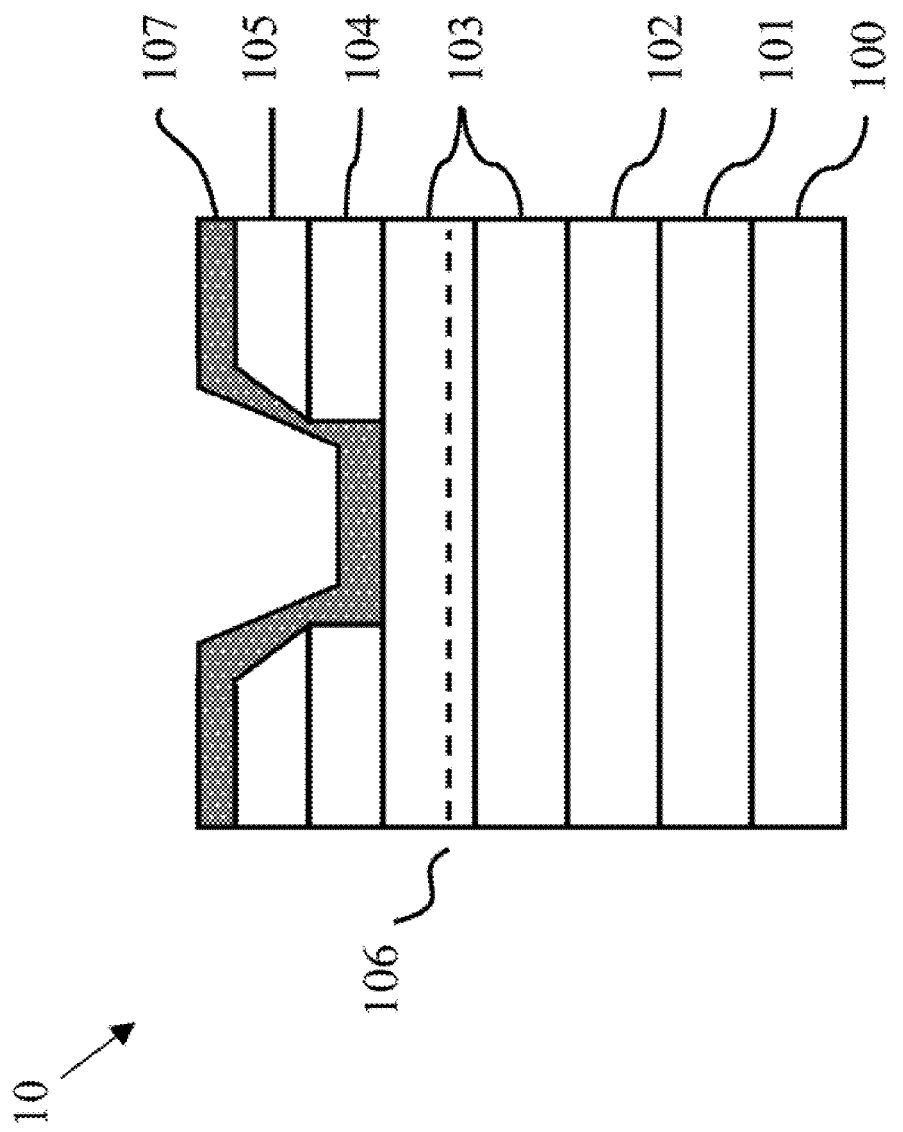

The foregoing structure in FIG. 1A is then etched to form a recess or trench structure as illustrated in FIG. 1B. The etch step may be performed by any known standard technique such as wet etching and dry etching. A gate dielectric layer 107 is subsequently deposited thereon through atomic layer deposition. The gate dielectric material may be selected from the group consisting of $Al_2O_3$, $HfO_2$, $La_2O_3$, $ZrO_2$, $Ga_2O_3$, $Y_2O_3$, $TiO_2$, $Ta_2O_5$, HfAlO, TiAlO, and LaAlO. Preferably, the gate dielectric material is selected from the group consisting of $Al_2O_3$, $HfO_2$, $La_2O_3$, and $ZrO_2$. In the illustrated structure shown in FIG. 1C, about 8 nm to about 20 nm $Al_2O_3$ is deposited at approximately 300° C. through atomic layer deposition. Preferably, a 16 nm thick $Al_2O_3$ is deposited from a source gas including trimethylalumium (TMA) and water vapor. In one example, a gas cycle of TMA, $N_2$, $H_2O$ and $N_2$ set at 1, 10, 1 and 10 seconds, respectively, is performed; and the deposit rate of aluminum oxide is about 1.3 Å per cycle. In one example, the ALD technology and system is supported by Instrument Technology Research Center (ITRC, Taiwan), however, it should be appreciated that tools provided by other manufacturer can be used to perform the atomic deposition as well. Compared to the conventional methods to form thin $Al_2O_3$ film, i.e., by sputtering, chemical vapor deposition or oxidation of pure Al film, the ALD $Al_2O_3$ is typically of higher quality. ALD is an ultra-thin-film deposition technique based on the sequential use of a gas phase reactants. By exposing the reacting gas to the growth surface repeatedly, the amount of film material deposited in each cycle remains constant and therefore enabling thickness control of the film on atomic scale. In the illustrative example, the $Al_2O_3$ gate dielectric film exhibits very low leakage current density of about $10^{-8}$ $A/cm^2$ for a film of about 16 nm in thickness.

Figure 1D:
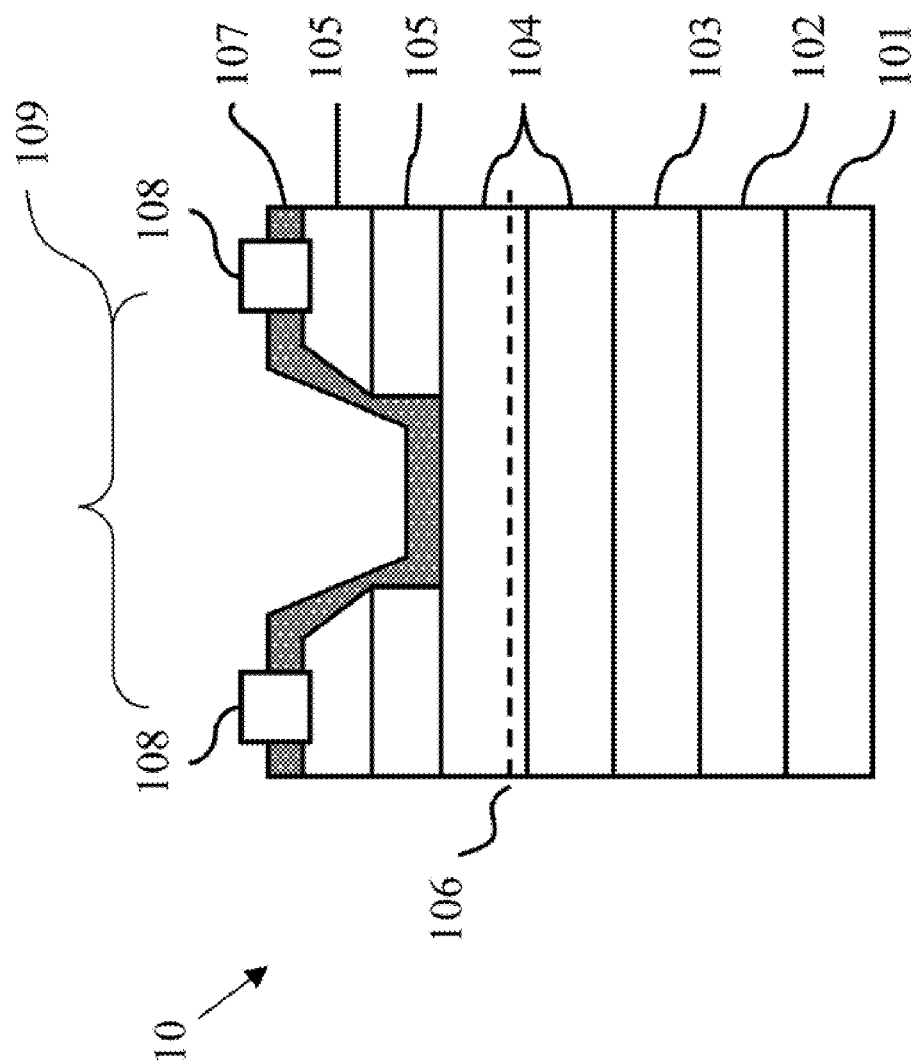
Figure 1E:
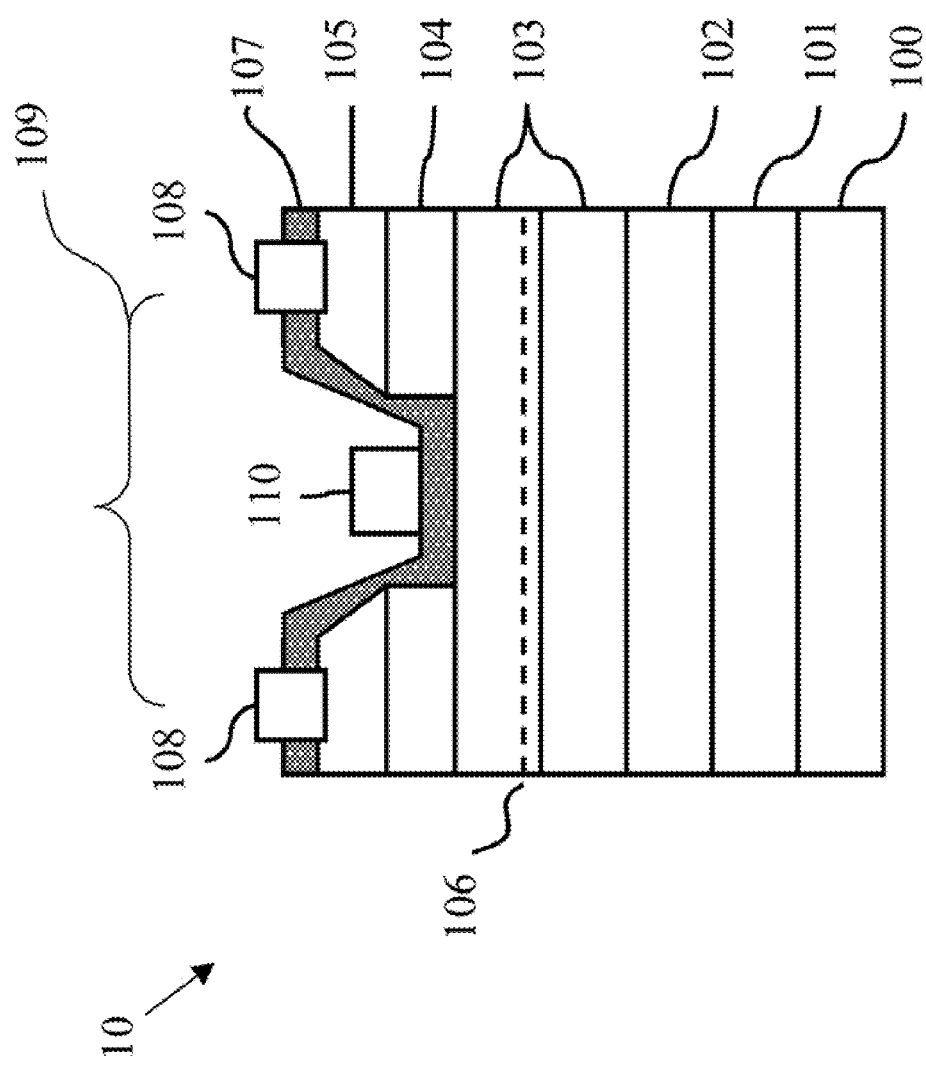

Next, in the illustrated example, ohmic contacts 108 are formed to couple to the compound substrate (i.e., the substrate 100 and the epitaxial layers thereon) approximate opposite sides of an active region 109 defined in the III-V compound semiconductor structure as shown in FIG. 1D. The ohmic contacts are formed by electron gun deposition (E-gun) of a metal selected from the group consisting of Ni, Ge, Cu, Pd, Au and the combinations thereof. In the illustrative example, Ge—Au is used to form ohmic contacts. Furthermore, a gate metal electrode 110 is formed on the gate dielectric 107 by an electron gun deposition (E-gun) process, and comprises an electrode formed from the material selected from the group consisting of Ti, Pt, Cu, Al, TaN, Au and the combinations thereof as used in forming the gate metal contacts. In the illustrative example, the gate electrode 110 is made from Ti—Au.

The embodiments disclosed herein are applicable across all III-V semiconductor wafers. The compound semiconductor structure formed according to the embodiments of the method of this disclosure can be used to fabricating various MMICs including SPDT switch. Suitable HEMT that may be fabricated in accordance with embodiments of the method described above includes, but is not limited to, a pseudomorphic high electron mobility transistor (PHEMT), a metal-oxide-semiconductor pseudomorphic high electron mobility transistor (MOS-PHEMT), a metal-semiconductor field effect transistor (MESFET) and a metamorphic high electron mobility transistor (MHEMT).

In one preferred example, a switch having about 0.5 μm gate length of the MOS-PHEMT structure fabricated by the procedures described above is provided. In this example, the MOS-PHEMT structure is characterized in having $Al_2O_3$ gate dielectrics of about 16 nm. The fabricated switch is then subjected to evaluation test including measurements of leakage current, control current and radio-frequency (RF) characteristics, with results provided in FIGS. 2 to 4.

Figure 2:
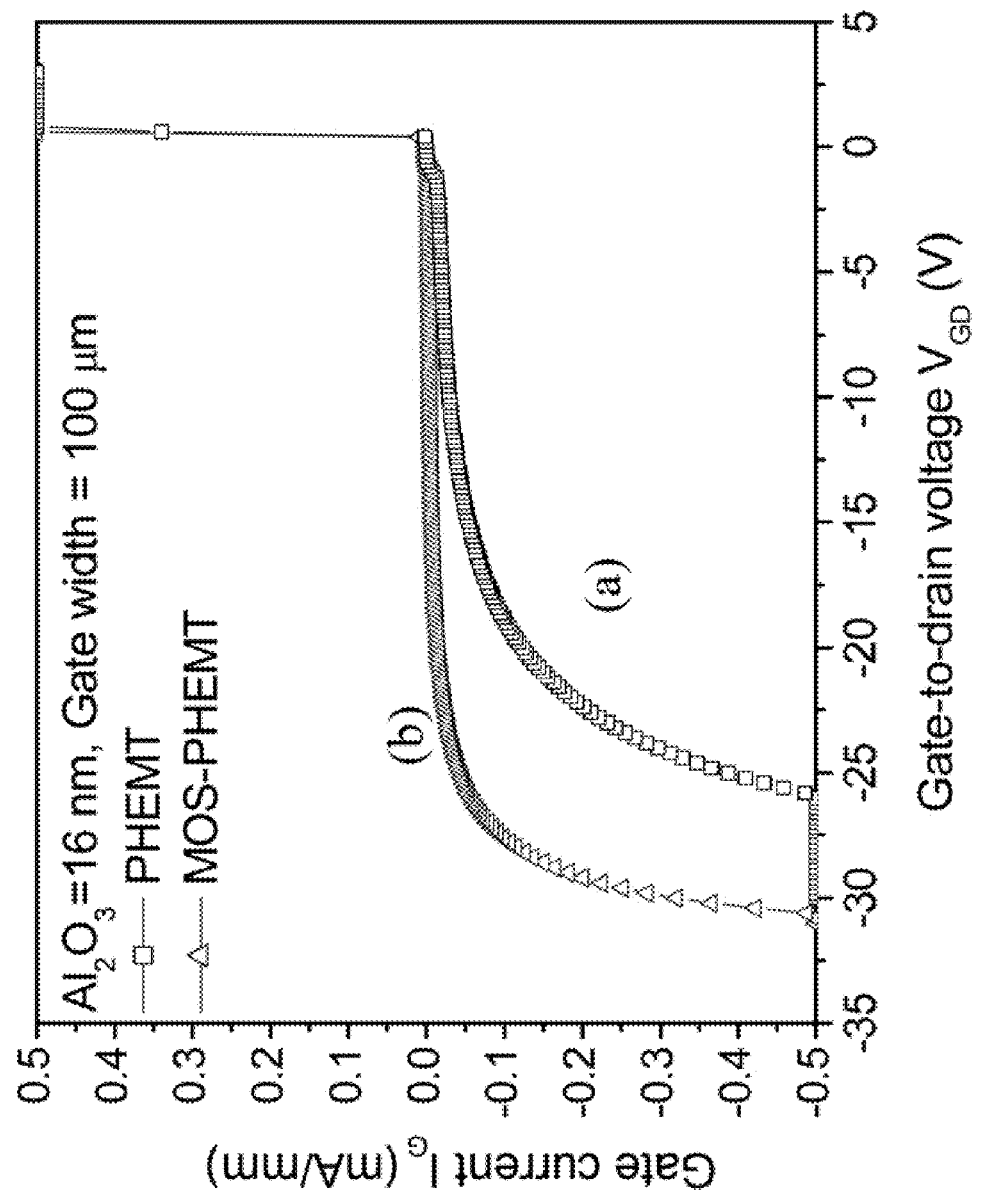
FIG. 2 is a graph illustrating the gate leakage current vs. voltage of (a) a conventional PHEMT device and (b) the MOS-PHEMT device fabrication in accordance with one embodiment of this disclosure.

Please refer to FIG. 2, compared with a switch made from a conventional PHEMT structure, the switch comprising the MOS-PHEMT of this disclosure exhibits a better tolerance to gate bias under varying voltage (FIG. 2), with almost no leak current at $V_{GD}=-25$ V, while the leak current of the switch having conventional PHEMT structure reaches a high level of about −0.5 mA/mm.

Figure 3:
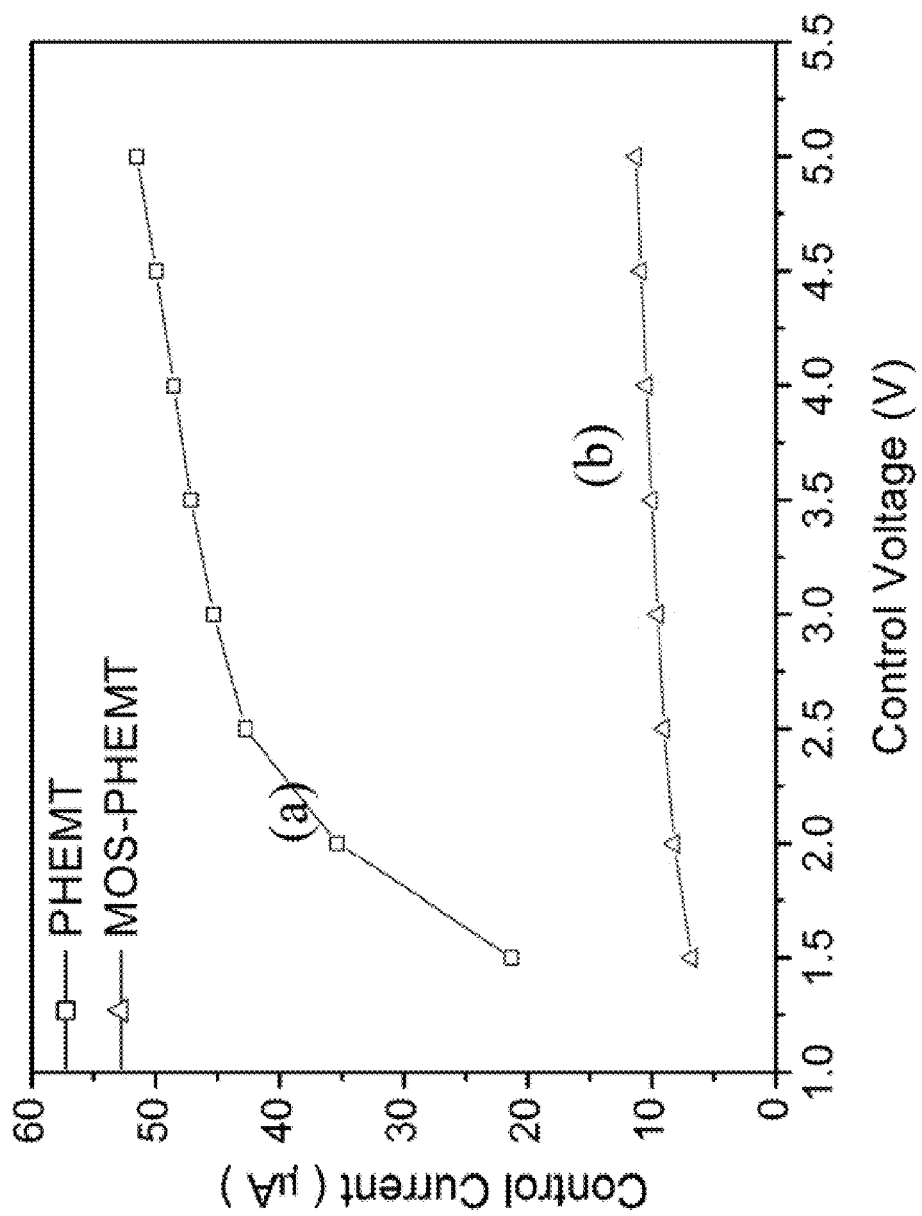
FIG. 3 is a graph illustrating the control current vs. control voltage of (a) a conventional PHEMT device and (b) the MOS-PHEMT device fabrication in accordance with one embodiment of this disclosure.

FIG. 3 illustrates the relationship between control current and control voltage of the SPDT switch. Compared to the switch made from conventional PHEMT structure; SPDT switch comprising the MOS-PHEMT structure of this disclosure exhibits a much lower control current throughout the entire test with voltage ranges from 1.5 V to 5.0 V.

Figure 4:
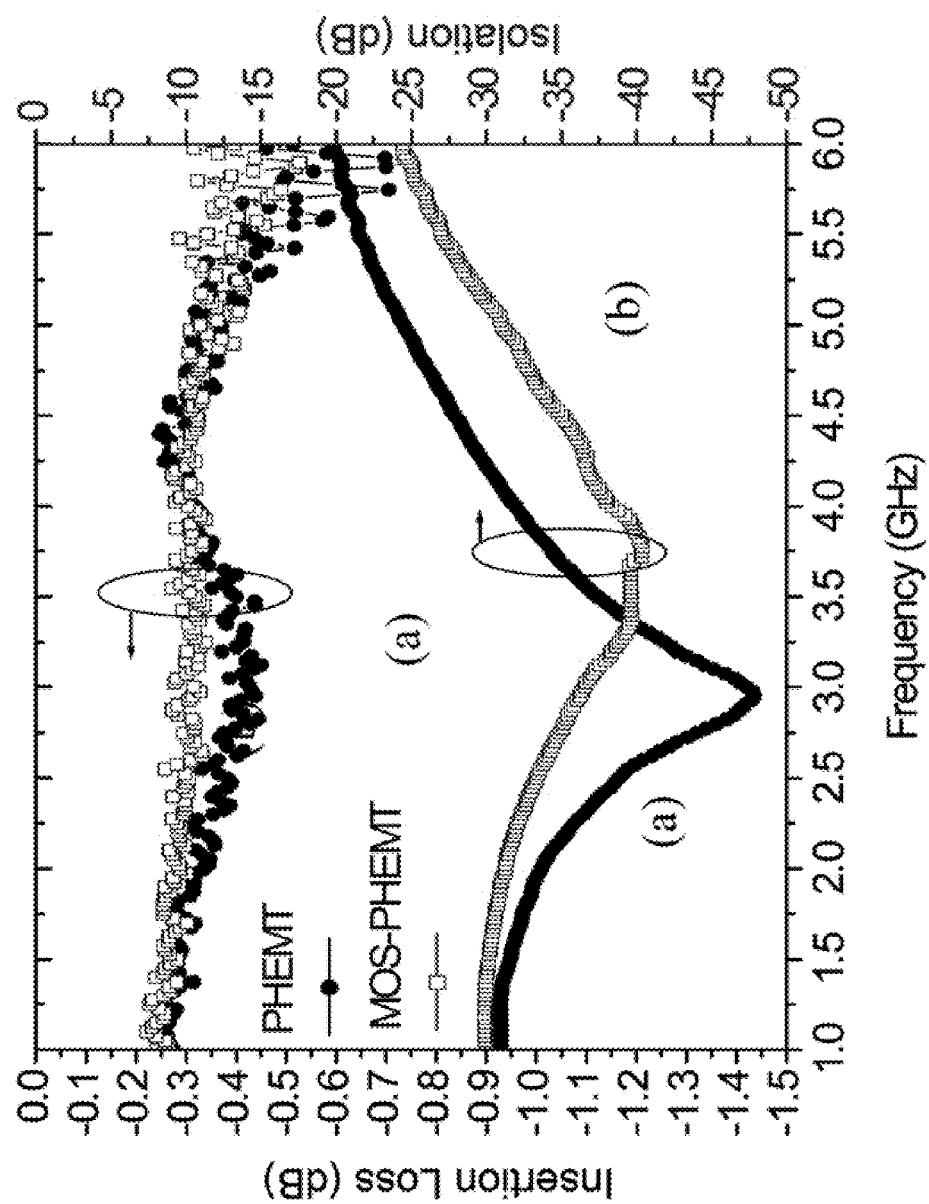
FIG. 4 is a graph illustrating the insertion loss vs. frequency of (a) a conventional PHEMT device and (b) the MOS-PHEMT device fabrication in accordance with one embodiment of this disclosure.

The performance of insertion loss and isolation of SPDT switch are illustrated in FIG. 4. The switch comprising MOS-PHEMT structure of this disclosure has an insertion loss of 0.3 dB and isolation of 33.4 dB at 2.5 GHz (control voltage=+3/0 V). The results in RF characteristics shows improved switch isolation and reduced insertion loss with the use of the MOS-PHEMT structure of this disclosure, which indicates that the MOS-PHEMT structure of this disclosure may be used to fabricate other MMICs.

TABLE 1

MOS-PHEMT Epitaxial Layer Sequence

|  | Function | Nominal thickness (Å) | Mole Fraction |
|---|---|---|---|
| Ge-Au, Ti-Au | Ohmic, Schottky contact | n/a | n/a |
| $Al_2O_3$ | Gate dielectric | 80-200 | n/a |
| n + GaAs | Capping | 600 | n/a |
| AlAs | Etch stop | 15 | n/a |
| Undoped AlGaAs | Barrier | 370 | Al = 0.25 |
| δ-doping | Electron supply | n/a | n/a |
| Undoped AlGaAs | Spacer | 30 | Al = 0.25 |
| Undoped InGaAs | Channel | 130 | In = 0.2 |
| Undoped GaAs | Buffer | n/a | n/a |
| Substrate (GaAs) |  | n/a | n/a | n/a: not determined

The foregoing description of various embodiments of the disclosure has been presented for purpose of illustration and description. It is not intended to be exhaustive or to limit the disclosure to the precise embodiments disclosed. Numerous modifications or variations are possible in light of the above teachings. The embodiments discussed were chosen and described to provide the best illustration of the principles of the disclosure and its practical application to thereby enable one of ordinary skill in the art to utilize the disclosure in various embodiments and with various modifications as are suited to the particular use contemplated. All such modifications and variations are within the scope of the disclosure as determined by the appended claims when interpreted in accordance with the breadth to which they are fairly, legally, and equitably entitled.

We claim:

1. A structure of a metal oxide semiconductor pseudomorphic high electron mobility transistor (MOS-PHEMT), comprising:
   a substrate;
   a III-V compound semiconductor, wherein the III-V compound semiconductor is etched to form a trench structure;
   a gate dielectric overlying the etched III-V compound semiconductor through atomic layer deposition, wherein the gate dielectric is selected from the group consisting of $Al_2O_3$, $HfO_2$, $La_2O_3$, and $ZrO_2$;
   ohmic contacts passing through the gate dielectric and coupled to the III-IV compound semiconductor; and
   a gate electrode disposed on the gate dielectric in the trench, thereby forming the MOS-PHEMT.

2. The structure of claim 1, wherein the gate dielectric is $Al_2O_3$.

3. The structure of claim 1, wherein the gate dielectric has a thickness of about 8 nm to about 20 nm.

4. The structure of claim 3, wherein the gate dielectric has a thickness of about 16 nm.

5. The structure of claim 1, wherein the ohmic contacts are made from a material selected from the group consisting of Ni, Ge, Cu, Pd, Au and combinations thereof, and the gate electrode is made from a material selected from the group consisting of Ti, Pt, Cu, Al, TaN, Au and combinations thereof.

6. The structure of claim 1, wherein the substrate is GaAs.

7. The structure of claim 1, wherein the III-V compound semiconductor comprises InGaAs and AlGaAs.

8. The structure of claim 7, wherein the InGaAs is undoped $In_{0.2}Ga_{0.8}As$, and the AlGaAs is $Al_{0.25}Ga_{0.75}As$ comprises a delta-dope therein.

9. The structure of claim 1, wherein the structure is useful as a transistor of a monolithic microwave integrated circuit (MMIC) single-pole-double-throw (SPDT) switch.

10. A method of fabricating a MOS-PHEMT of claim 1 for a MMIC SPDT switch, comprising:
    forming a III-V compound semiconductor on a substrate;
    etching the III-V compound semiconductor to form a trench structure;
    forming a gate dielectric on the etched III-V compound semiconductor through atomic layer deposition, in which the gate dielectric is selected from the group consisting of $Al_2O_3$, $HfO_2$, $La_2O_3$, and $ZrO_2$;
    forming ohmic contacts that pass through the gate dielectric and are coupled to the III-V compound semiconductor; and
    applying a metal on the gate dielectric to form a gate electrode in the trench, thereby forming the MOS-PHEMT.

11. The method of claim 10, wherein the substrate is GaAs.

12. The method of claim 10, wherein forming a III-V compound semiconductor comprises forming InGaAs on GaAs, and forming AlGaAs on InGaAs.

13. The method of claim 12, wherein forming a III-V compound semiconductor comprises forming $In_{0.2}Ga_{0.8}As$ on GaAs, and forming $Al_{0.25}Ga_{0.75}As$ on $In_{0.2}Ga_{0.8}As$, wherein the $Al_{0.25}Ga_{0.75}As$ comprises a delta-dope therein.

14. The method of claim 10, wherein forming a gate dielectric comprises depositing $Al_2O_3$ to a thickness of about 8 nm to about 20 nm on the III-V compound semiconductor.

15. The method of claim 14, wherein forming a gate dielectric comprises depositing $Al_2O_3$ to a thickness of about 16 nm on the III-V compound semiconductor.

16. The method of claim 10, wherein the ohmic contacts are made from a material selected from the group consisting of Ni, Ge, Cu, Pd, Au and combinations thereof, and the gate electrode is made from a material selected from the group consisting of Ti, Pt, Cu, Al, TaN, Au and combinations thereof.

17. The method of claim 16, wherein forming ohmic contacts comprises depositing Ge/Au through electron gun deposition (E-gun); and applying a metal comprises placing Ti/Au onto the gate dielectric to form the gate electrode.

18. A GaAs MOS-PHEMT switch comprising the structure of claim 1, in which the structure comprises the gate dielectric of $Al_2O_3$ deposited to a thickness of about 16 nm, and the switch has a gate length of about 0.5 μm.

* * * * *